(12) United States Patent
Fukatsu et al.

(10) Patent No.: US 7,300,518 B2
(45) Date of Patent: Nov. 27, 2007

(54) APPARATUS AND METHOD FOR PRODUCING SINGLE CRYSTAL, AND SILICON SINGLE CRYSTAL

(75) Inventors: Norihito Fukatsu, Yonezawa (JP); Kazuyuki Egashira, Saga (JP); Senrin Fu, Saitama (JP)

(73) Assignee: Sumco Corporation, Tokyo (JP)

( * ) Notice: Subject to any disclaimer, the term of this patent is extended or adjusted under 35 U.S.C. 154(b) by 183 days.

(21) Appl. No.: 11/131,333

(22) Filed: May 18, 2005

(65) Prior Publication Data

US 2006/0107889 A1    May 25, 2006

(30) Foreign Application Priority Data

May 19, 2004    (JP)    ............................ P2004-149251

(51) Int. Cl.
 *C30B 15/20*    (2006.01)
 *C30B 35/00*    (2006.01)
(52) U.S. Cl. ............................ 117/30; 117/32; 117/45; 117/917
(58) Field of Classification Search .................. 117/19, 117/20, 45, 917, 30, 32
See application file for complete search history.

(56) References Cited

FOREIGN PATENT DOCUMENTS

| JP | 2000-272992 A | 10/2000 |
| JP | 2001-158690 A | 6/2001 |
| JP | 2003-002783 A | 1/2003 |
| JP | 2003-002784 A | 1/2003 |
| JP | 2003-055092 A | 2/2003 |

OTHER PUBLICATIONS

Jung, et al., Effect of the crystal-melt interface on the grown-in defects in silicon CZ growth,☐☐Journal of Crystal Growth (2007), vol. 299(1), pp. 152-157.*

* cited by examiner

*Primary Examiner*—Felisa Hiteshew
(74) *Attorney, Agent, or Firm*—Pillsbury Winthrop Shaw Pittman, LLP

(57) ABSTRACT

The invention provides an apparatus for producing a single crystal, and a method for producing a silicon single crystal using the same. An apparatus for producing a single crystal includes a heating device which heats polycrystalline silicon raw material held in a crucible to form silicon melt, and a pulling up device which grows a silicon single crystal while pulling it up from the silicon melt accompanied with rotation. By providing the apparatus with a magnetic field generation unit which applies to the silicon melt a cusp magnetic field a shape of neutral plane of which is symmetric around the rotation axis of the silicon single crystal and is curved in the upward direction, various conditions for producing a silicon single crystal having a defect free region is relaxed, and a silicon single crystal having a defect free region is produced at high efficiency.

6 Claims, 6 Drawing Sheets

FIG. 4

| CLASSIFICATION | MAGNETIC FIELD INTENSITY (T) | POSITION OF MAGNETIC FIELD (mm) | PROTRUSION RATIO 1 (mm) | PROTRUSION RATIO 2 (mm) | ROTATION SPEED OF CRYSTAL (rpm) | ROTATION SPEED OF CRUCIBLE (rpm) |
|---|---|---|---|---|---|---|
| EXAMPLE 1 | 0.035 | -100 | 18 | 5 | 13 | 1 |
| EXAMPLE 2 | 0.035 | -100 | 10 | 4 | 13 | 1 |
| EXAMPLE 3 | 0.035 | -100 | 8 | 8 | 13 | 1 |
| EXAMPLE 4 | 0.035 | -180 | 18 | 5 | 13 | 1 |
| EXAMPLE 5 | 0.010 | -100 | 18 | 5 | 13 | 1 |
| EXAMPLE 6 | 0.035 | -100 | 18 | 5 | 13 | 5 |
| COMPARATIVE EXAMPLE 1 | 0.035 | -100 | HORIZONTAL MAGNETIC FIELD NEUTRAL PLANE | | 13 | 1 |
| COMPARATIVE EXAMPLE 2 | 0.035 | -180 | | | 13 | 1 |
| COMPARATIVE EXAMPLE 3 | 0.010 | -100 | | | 13 | 1 |
| COMPARATIVE EXAMPLE 4 | 0.035 | -100 | | | 13 | 5 |

FIG. 7

| CLASSIFICATION | SHAPE OF SOLID-LIQUID INTERFACE (mm) | V1 (mm/min) | V2 (mm/min) | V1-V2 (mm/min) |
|---|---|---|---|---|
| EXAMPLE 1 | 25 | 0.643 | 0.612 | 0.031 |
| EXAMPLE 2 | 20 | 0.602 | 0.548 | 0.018 |
| EXAMPLE 3 | 22 | 0.589 | 0.565 | 0.024 |
| EXAMPLE 4 | 18 | 0.557 | 0.541 | 0.016 |
| EXAMPLE 5 | 19 | 0.582 | 0.563 | 0.019 |
| EXAMPLE 6 | 2 | 0.490 | 0.482 | 0.008 |
| COMPARATIVE EXAMPLE 1 | 20 | 0.607 | 0.595 | 0.012 |
| COMPARATIVE EXAMPLE 2 | 14 | 0.539 | 0.522 | 0.017 |
| COMPARATIVE EXAMPLE 3 | 15 | 0.541 | 0.529 | 0.012 |
| COMPARATIVE EXAMPLE 4 | -1 | 0.450 | 0.44 | 0.010 |

APPARATUS AND METHOD FOR PRODUCING SINGLE CRYSTAL, AND SILICON SINGLE CRYSTAL

BACKGROUND OF THE INVENTION

1. Field of the Invention

The invention relates to an apparatus and a method for producing a silicon single crystal by crystal pulling by the Czochralski method (the CZ method), and to a silicon single crystal produced using the same method.

Priority is claimed on Japanese Patent Application No. 2004-149251, filed 19 May, 2004, the content of which is incorporated herein by reference.

2. Description of Related Art

To produce a silicon single crystal, polycrystalline silicon raw material is held in a crucible and is heated by a heater to form silicon melt, and the silicon single crystal is grown while being pulled up from of the silicon melt by the CZ method. Silicon wafers are produced by slicing (cutting) the silicon single crystal produced by the above described method, and integrated circuits are formed upon the silicon wafers. For forming integrated circuits upon a silicon wafer, there are demands for a silicon wafer with high quality and free from defects such as OSFs (Oxidation Induced Stacking Faults), COPs (Crystal-Originated Particles), L/DLs (Large Dislocation Loops), and the like.

Here, the OSFs are a type of crystal defect formed on the surface or in the interior of the silicon wafer and are stacking faults caused by oxidation. An OSF upon the surface of the silicon wafer is generated due to residual strain or contamination of a surface neighborhood, while an OSF interior to the silicon wafer is generated due to precipitates caused by supersaturated oxygen. The COPs are those defects of crystalline origin which occur at the surface of the silicon wafer, due to etching of the silicon single crystal during the washing process, and are counted as particles by a particle counter. The L/DLs are termed dislocation clusters, or dislocation pits, since, when a silicon wafer generating these defects is dipped into a selective etching liquid mainly composed of hydrofluoric acid, the defects generate oriented etch pits. The L/DLs also cause a deterioration of the electrical properties, such as leak properties, the isolation properties.

For a effective production of a silicon single crystal having a defect free region throughout the entire length, it is needed to maintain specific growth conditions of the silicon single crystal. For example, the following Patent References 1 to 5 disclose techniques for producing a silicon single crystal having a defect free region by pulling the silicon single crystal while applying a cusp magnetic field. In particular, in Patent References 1 and 4, a shape of the solid-liquid interface between the growing silicon single crystal and the silicon melt is made in an upwardly protruding shape in order to enlarge the defect free region, and practical controlling conditions to obtain this shape are disclosed. If the shape of the solid-liquid interface is controlled upwardly protruding, a thermal gradient is increased in the vertical direction at the center of the silicon single crystal during pulling, and as a result it becomes easy to obtain a defect free region, since the distribution of defects is made constant in the radial direction of the silicon single crystal (in other words, over the surface of a silicon wafer which sliced from the silicon single crystal).

According to Voronkov's theory (V. V. Voronkov) well known in the related field, where a value showing the ratio of the pulling speed of the silicon single crystal V and the thermal gradient G in the vertical direction within the silicon single crystal near the solid-liquid interface is given by V/G, according to the difference in V/G value whether exceeding or not exceeding a critical value, the silicon single crystal being produced has vacancy type point defects, or interstitial silicon type point defects. A defect free region is formed when the V/G value is near the critical value. If the V/G value cannot be controlled to be at or vicinity of abovementioned critical or near critical value throughout the entire extent of the silicon single crystal from its center to its circumference, a silicon wafer sliced from the produced silicon single crystal is a mixture of defect free region and defected bearing region. Accordingly, to obtain a defect free region, it is necessary to control the radial variation of the V/G to be low sufficiently. Furthermore, when the thermal gradient G in the vertical direction of the silicon single crystal is increased, to maintain the constant V/G value, pulling speed V must be increased resulting in the enhancement of a productivity of the silicon single crystal.

Since convection of the silicon melt have a great influence on the shape of the solid-liquid interface, in the following Patent References 1 to 5, a cusp magnetic field or a horizontal magnetic field is applied to the silicon melt, and by restricting magnetic field intensity and applying location of the magnetic field, further controlling the rotation speed of the silicon single crystal and the rotation speed of the crucible, convection of the silicon melt is controlled for setting the requisite shape of the solid-liquid interface. To form an upwardly protruding shape of the solid-liquid interface as in Patent References 1 and 4, it is extremely important to control the up stream rising from the bottom of the crucible to the silicon melt surface to force up the liquid-solid interface to have an upwardly protruding shape.

Patent Reference 1: Japanese Unexamined Patent Application, First Publication No. 2001-158690.
Patent Reference 2: Japanese Unexamined Patent Application, First Publication No. 2000-272992.
Patent Reference 3: Japanese Unexamined Patent Application, First Publication No. 2003-002783.
Patent Reference 4: Japanese Unexamined Patent Application, First Publication No. 2003-002784.
Patent Reference 5: Japanese Unexamined Patent Application, First Publication No. 2003-055092.

As described above, a defect free region is formed within the silicon single crystal when the V/G value is a certain specified value. Furthermore, if it is possible to set the V/G value to be the specified value throughout the entire plane of the silicon single crystal, and maintain the V/G value at the specified value from starting to ending of pulling the silicon single crystal, a silicon single crystal having a defect free region throughout its entire length cane be produced.

However, since the allowable range for the V/G value capable of forming a defect free region is extremely narrow, it is extremely difficult to setting the V/G value to be the specified value throughout the entire plane of the silicon single crystal, and maintain the V/G value within the allowable range from starting to ending of pulling the silicon single crystal. Furthermore, it is also difficult to obtain very large thermal gradient G in the vertical direction while pulling the silicon single crystal. Therefore, increase of pulling speed of the silicon single crystal is restricted, thus being impossible to highly enhance the productivity of the silicon single crystal. Furthermore, the narrow allowable range of the V/G value results in narrow allowable range of the pulling speed of the silicon single crystal. By deviation of pulling speed from the allowable range, defects are generated partially in the silicon single crystal.

The objective of the invention being conceived in the light of the above described situation is to provide an apparatus and a method for producing a silicon single crystal effectively producing a silicon single crystal having a defect free region by relaxing various conditions for producing a single crystal having a defect free region, and a silicon single crystal produced using the method.

SUMMARY OF THE INVENTION

The apparatus for producing a single crystal according to the invention is an apparatus having: a heating device (12) which heats polycrystalline silicon raw material held in a crucible (11) to form silicon melt (M); and a pulling up device (14) which grows a silicon single crystal (20) while pulling it up from the silicon melt accompanied with rotation, wherein a magnetic field generation unit(13a, 13b) which applies to the silicon melt a cusp magnetic field a shape of neutral plane (NP) of which is symmetric around the rotation axis (LX) of the silicon single crystal and is curved in the upward direction.

Here, the magnetic field generation unit generates the cusp magnetic field so that the difference between the vertical position of the magnetic field neutral plane upon the rotation axis and the vertical position of the magnetic field neutral plane at a wall position (P) of the crucible is greater than or equal to 15 mm.

Otherwise, the magnetic field generation unit generates the cusp magnetic field so that the difference between the vertical position of the magnetic field neutral plane upon the rotation axis and the vertical position of the magnetic field neutral plane at an intermediate position (MP) between the rotation axis and the wall position of the crucible is less than or equal to 10 mm, and the difference between the vertical position of the magnetic field neutral plane at the intermediate position and the vertical position of the magnetic field neutral plane at the wall position of the crucible is greater than or equal to 10 mm.

In an apparatus for producing a single crystal according to the invention, the magnetic field generation unit varies the curvature of the magnetic field neutral plane according to the solidification ratio of the silicon melt.

An apparatus for producing a single crystal according to the invention comprises a rotation device (15) which, when pulling the silicon single crystal, rotates the crucible at a rotation speed less than or equal to 3 $min^{-1}$. The magnetic field generation unit generates the cusp magnetic field so that the vertical position of the magnetic field neutral plane is within the range of from 30 mm to 120 mm below the solid-liquid interface (In), and the horizontal component of the magnetic flux density at the vertical position of the magnetic field neutral plane at the wall position of the crucible is within the range of from 0.02 T to 0.09 T. The pulling up device pulls the silicon single crystal while rotating it in a direction opposite to the rotation direction of the crucible at a rotation speed greater than or equal to 12 $min^{-1}$.

In an apparatus for producing a single crystal according to the invention, when pulling the silicon single crystal, the pulling up device makes the shape of the solid-liquid interface upwardly protruding, with the height of its central portion with respect to its peripheral portion exceeding 10 mm.

In order to solve the above described problems, in a method for producing a single crystal of the invention, which holds polycrystalline silicon raw material in a crucible (11) and heats it to form silicon melt (M), and grows a silicon single crystal (20) by pulling up from the silicon melt accompanied with rotation, the silicon single crystal is grown by pulling from the silicon melt applied with a cusp magnetic field the neutral plane (NP) of which is symmetric around the rotation axis (LX) of the silicon single crystal and is curved in the upward direction.

Here, the cusp magnetic field is generated so that the difference in the vertical position of the magnetic field neutral plane between the position upon the rotation axis and the wall position of the crucible (P) is greater than or equal to 15 mm.

Otherwise, the cusp magnetic field is generated so that the difference between the vertical position of the magnetic field neutral plane upon the rotation axis and that at an intermediate position (MP) between the rotation axis and the wall position of the crucible is less than or equal to 10 mm, and moreover the difference between the vertical position of the magnetic field neutral plane at the intermediate position and that at the wall position of the crucible is greater than or equal to 10 mm.

In a method for producing a single crystal of the invention, the amount of curvature of the magnetic field neutral plane is varied according to the solidification ratio of the silicon melt.

In a method for producing a single crystal of the invention, the cusp magnetic field is generated so that the vertical position of the magnetic field neutral plane is within the range of 30 mm to 120 mm below the solid-liquid interface (In), and the horizontal component of the magnetic flux density at the wall position of the crucible is within the range of 0.02 T to 0.09 T. The silicon single crystal is pulled while the crucible is rotated at a rotation speed less than or equal to 3 $min^{-1}$, and the silicon single crystal is rotated in a direction opposite to the rotation direction of the crucible at a rotation speed greater than or equal to 12 $min^{-1}$.

In a method for producing a single crystal of the invention, the silicon single crystal is pulled while the solid-liquid interface is controlled to have upwardly protruding shape the height of central portion of which exceeds 10 mm with respect to its peripheral portion.

A silicon single crystal of the invention is produced using a method for producing a single crystal as described in any of the above.

The invention have a objective to produce a silicon single crystal having a defect free region at high efficiency. In the invention, in order to attain this objective, in an apparatus for producing single crystal comprising heating device which heats polycrystalline silicon raw material held in a crucible to form silicon melt, and a pulling device which grows silicon single crystal by pulling it up from the silicon melt accompanied with rotation, a magnetic field generation unit is provided to apply to the silicon melt a cusp magnetic field the shape of neutral plane of which is symmetric around the rotation axis of the silicon single crystal and is curved in the upward direction.

According to this invention, the silicon single crystal is grown while being pulled, while the silicon melt is applied with a cusp magnetic field the shape of neutral plane of which is symmetric with respect to the rotation axis of the silicon single crystal and is curved upward. Accordingly, in the region near the wall position of the crucible, vertical component of the magnetic field is generated and the silicon melt flow in the horizontal direction is controlled. Due to this, a low temperature region spreads out at the surface of the silicon melt, and a downward flow in the downward vertical direction is promoted. The upward flow of the silicon melt in the center portion of the crucible is enhanced, so that the degree of upward protrusion of the solid-liquid interface is increased, and at the solid-liquid interface neighborhood, thermal gradient in the vertical direction is increased. As a result, the pulling speed of the silicon single crystal is increased, and a silicon single crystal having a defect free region is produced with good efficiency.

Here, the control of the curved shape of the magnetic field neutral plane is needed to generate the convection of the silicon melt a preferable shape. Therefore, in the invention, the magnetic field generation unit forms the cusp magnetic field so that the difference between the vertical position of the magnetic field neutral plane upon the rotation axis and that at the wall position of the crucible is greater than or equal to 15 mm. Otherwise, the cusp magnetic field is formed so that the difference between the vertical position of the magnetic field neutral plane upon the rotation axis and that at an intermediate position between the rotation axis and the wall position of the crucible is less than or equal to 10 mm, and the difference between the vertical position of the magnetic field neutral plane at the intermediate position and the vertical position of the magnetic field neutral plane at the wall position of the crucible is greater than or equal to 10 mm.

According to this invention, the cusp magnetic field is formed so that the difference between the vertical position of the magnetic field neutral plane upon the rotation axis and that at the wall position of the crucible is greater than or equal to 15 mm. Otherwise, the cusp magnetic field is formed so that the difference between the vertical position of the magnetic field neutral plane upon the rotation axis and that at an intermediate position between the rotation axis and the wall position of the crucible is less than or equal to 10 mm, and the difference between the vertical position of the magnetic field neutral plane at the intermediate position and the vertical position of the magnetic field neutral plane at the wall position of the crucible is greater than or equal to 10 mm. Accordingly the convection of the silicon melt is controlled to a desirable shape by the vertical component of the magnetic field, and this is extremely appropriate to increase the thermal gradient in the vertical direction near the solid-liquid interface.

In order to form the defect free region throughout the entire lengthwise direction of the silicon single crystal, it is necessary to maintain, at the solid-liquid interface neighborhood, a large thermal gradient in the vertical direction from the starting until ending the pulling of the silicon single crystal. Therefore, in the invention, the apparatus for producing a single crystal of the invention, by the magnetic field generation unit, varies the curvature of the magnetic field neutral plane according to the solidification ratio of the silicon melt.

In this invention, since the curvature of the magnetic field neutral plane is varied in accordance with the solidification ratio of the silicon melt, convection of the silicon melt is controlled according to the solidification ratio of the silicon melt. As a result, a large thermal gradient in the vertical direction is maintained near the solid-liquid interface from starting until ending of pulling the silicon single crystal.

By the curvature of magnetic field neutral plane, in the region near the wall position of the crucible, vertical component of the magnetic field is generated and the silicon melt flow in the horizontal direction is controlled, and the rising flow of the silicon melt in the center portion of the crucible is enhanced. However, in order to obtain a greater thermal gradient in the vertical direction near the solid-liquid interface, it is necessary to control the convection of the silicon melt in a more concrete manner. Therefore, in the invention, a rotation device which, when pulling the silicon single crystal, rotates the crucible at a rotation speed less than or equal to 3 $min^{-1}$ is provided. The magnetic field generation unit generates the cusp magnetic field so that the vertical position of the magnetic field neutral plane is within the range of from 30 mm to 120 mm below the solid-liquid interface, and at the wall position of the crucible, the horizontal component of the magnetic flux density at the vertical position of the magnetic field neutral plane is within the range of from 0.02 T to 0.09 T. The pulling up device pulls the silicon single crystal while rotating it in a direction opposite to the rotation direction of the crucible at a rotation speed greater than or equal to 12 $min^{-1}$. By doing this, the convection of the silicon melt is effectively controlled, and this is extremely appropriate for producing a silicon single crystal having a defect free region at good efficiency.

In the invention, when the silicon single crystal is pulled by the pulling up device, the shape of the solid-liquid interface is controlled upwardly protruding, with the height of its central portion exceeding 10 mm with respect to its peripheral portion.

According to this invention, the silicon single crystal is pulled while making the shape of the solid-liquid interface upwardly protruding, with the height of its central portion exceeding 10 mm with respect to its peripheral portion. Accordingly, the thermal gradient in the vertical direction at the solid-liquid interface neighborhood is increased, and it is possible to pull a silicon single crystal at a high pulling speed.

According to the invention, since the silicon single crystal is grown by pulling while applying to the silicon melt a cusp magnetic field neutral plane of which is symmetric around the rotation axis of the silicon single crystal, and is moreover curved in the upward direction, it is possible to pull a silicon single crystal having defect free region at high efficiency.

BRIEF DESCRIPTION OF THE DRAWINGS

FIG. 4 is a table showing various conditions for producing a silicon single crystal in examples of the invention.

FIG. 7 is a table showing the results of evaluating silicon single crystals produced in the examples of the invention.

DETAILED DESCRIPTION OF THE INVENTION

Figure 1:
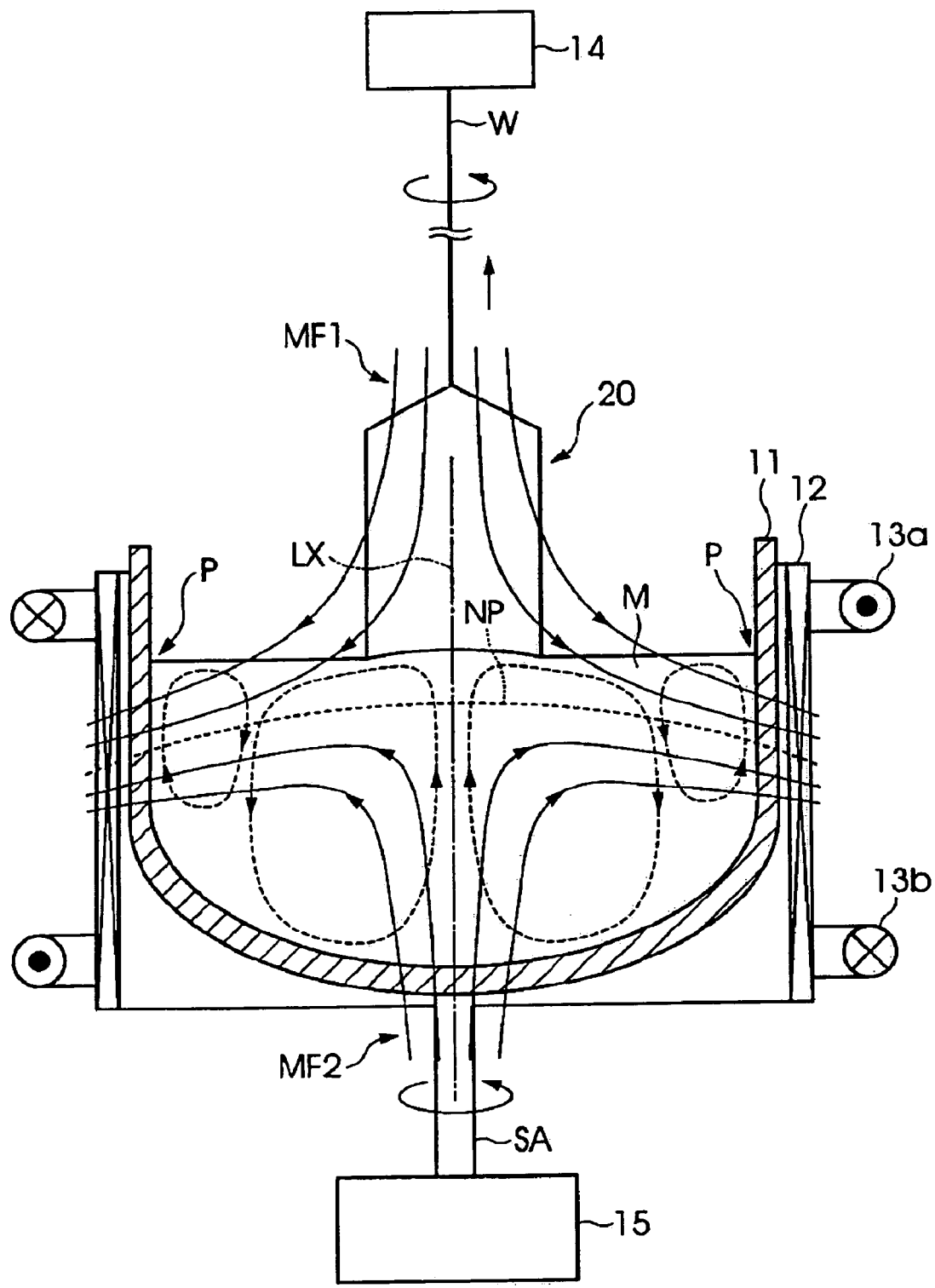
FIG. 1 is a schematic view illustrating the structure of an apparatus for producing a single crystal according to an embodiment of the invention.

In the following, an apparatus and method for producing a single crystal, and a silicon single crystal, according to an embodiment of the invention will be explained in detail with reference to the drawings. FIG. 1 is a schematic view illustrating the overall structure of an apparatus for producing a single crystal in an embodiment of the invention. As shown in FIG. 1, the apparatus of this embodiment for producing a single crystal comprises a crucible 11, a heater 12, an upper coil 13a, a lower coil 13b, a pulling up device 14, and a rotation device 15. The crucible 11 is made from quartz or the like, and is filled with a polycrystalline silicon raw material. The heater 12 includes, for example, a high frequency wave heating device or a resistance heating device, and is arranged around the circumference of the crucible 11 and heats up the crucible 11, thus converting the polycrystalline silicon raw material to formsilicon melt M.

The upper coil 13a and the lower coil 13b are devices for applying a cusp magnetic field to the silicon melt M filled in the crucible 11, and have a coil diameter larger than the outer diameter of the crucible 11, and are arranged so as to enclose the crucible 11 and the heater 12, with the center of each of the coils being concentric with the rotation axis of the crucible 11. The upper coil 13a and the lower coil 13b are arranged in the vertical direction with a predetermined spacing. By generating electrical currents being flowed through the upper coil 13a and the lower coil 13b in mutually opposite directions, the upper coil 13a generates a magnetic field MF1 oriented downwards, and the lower coil 13b generates a magnetic field MF2 oriented upwards, thereby the cusp magnetic field is formed as shown in FIG. 1.

The pulling up device 14 is a device for rotating and lifting up a pulling wire W at the end of which a seed crystal is fixed. A silicon single crystal is grown by contacting the lower end of the seed crystal at the surface of the melt M and pulling it upwards accompanied with rotation. The rotation device 15 is a device for rotating the crucible 11 by rotating a support shaft SA fitted to the central portion of the bottom of the crucible 11. A silicon single crystal 20 is produced by controlling the temperature of heating by the heater 12, the electric current flowing in the upper coil 13a and in the lower coil 13b, the pulling speed and the rotation speed of the pulling wire W by the pulling up device 14, and the rotation speed of the crucible 11 by the rotation device 15.

In this embodiment, the magnetic field neutral plane NP of the cusp magnetic field formed by the upper coil 13a and the lower coil 13b is symmetric around the rotation axis LX of the silicon single crystal 20 being pulled up by the pulling up device 14, and is formed in a shape being curved in the upward direction. The reason for making the magnetic field neutral plane NP in this shape is to produce a silicon single crystal 20 having defect free region at high production efficiency. In the following, the reasons will be explained why, by making the magnetic field neutral plane NP in this curved shape, it is possible to produce a silicon single crystal 20 having defect free region at high efficiency.

Figure 2:
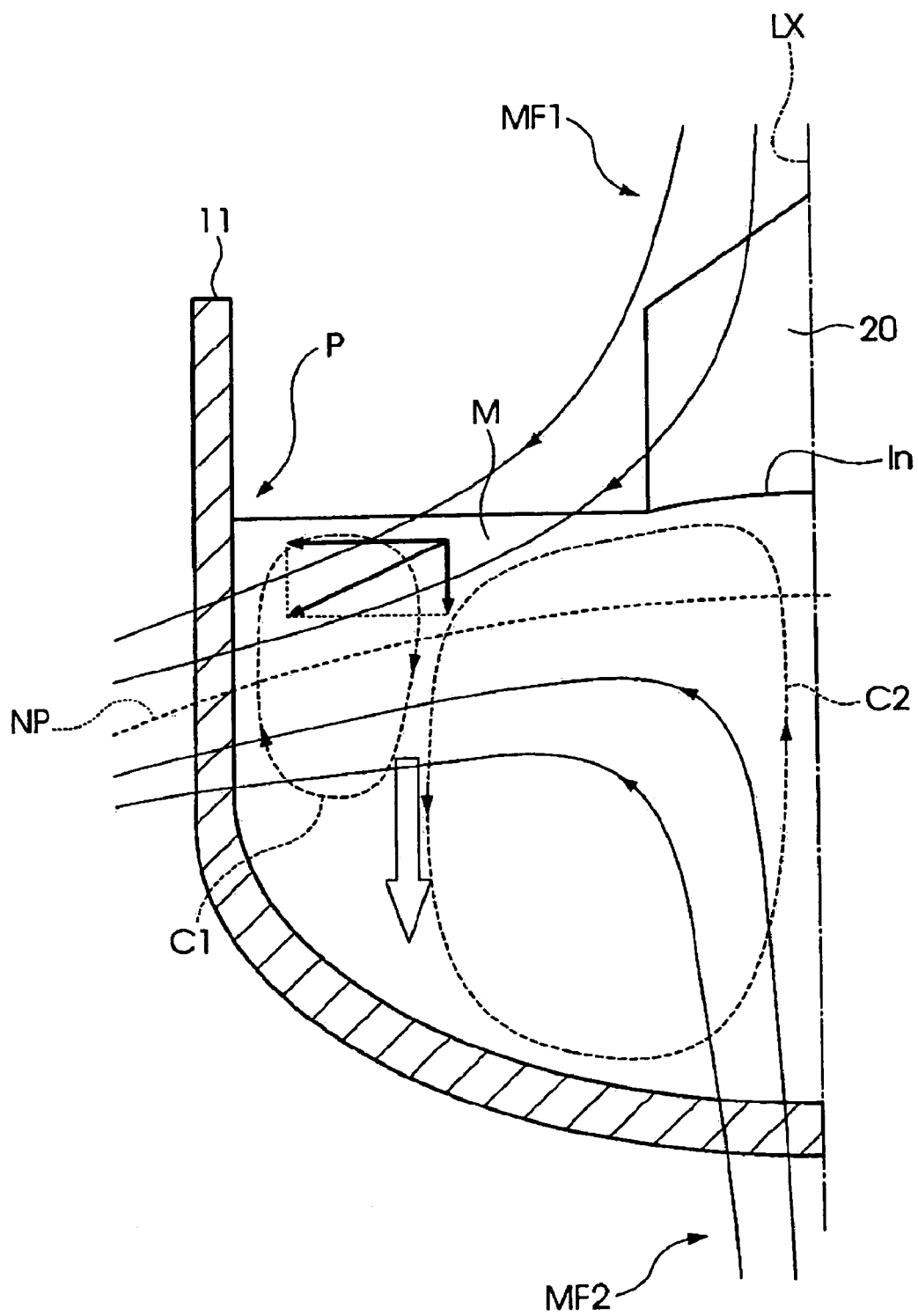
FIG. 2 is an enlarged view of the interior of a crucible 11.

FIG. 2 is an enlarged view of the interior portion of the crucible 11. When a cusp magnetic field is formed so that its magnetic field neutral plane NP has a shape curved in the upward direction, the direction of the magnetic lines through the near surface region of the silicon melt near the inner surface of circumferential wall P of the crucible 11 is sloped downwardly as shown in FIG. 2. Therefore, in this region, a vertical magnetic field component is generated or enhanced, and convection flow of the silicon melt M in the horizontal direction is suppressed.

The temperature at the surface of the silicon melt M is higher near the wall of the crucible 11 than at the center portion of the crucible 11. Therefore, a convection C1 is generated, near the wall of the crucible 11, rising along the wall of the crucible 11, and after flowing along the surface of the silicon melt M towards the center of the crucible 11, descending in the downward direction. As a convection generated in the crucible 11 other than above described convection C1, also exists a convection C2 after rising from the bottom portion of the crucible 11 in the center portion of the crucible 11 and striking against the solid-liquid interface In, spreading out towards the inner surface of circumferential wall P of the crucible 11 and striking against the convection C1, and descending in the downward direction.

When the cusp magnetic field is formed so that its magnetic field neutral plane NP has a shape curved in the upward direction, since the convection C1 towards the center is suppressed by the vertical magnetic field component generated near the wall of the crucible 11, temperature distribution is changed and low temperature region of the silicon melt surface at the center of the crucible 11 spreads in the direction of the wall of the crucible 11. Therefore, the convections C1 and C2 towards the bottom portion of the crucible 11 are promoted, and the upward flow at the center portion of the crucible 11 is enhanced.

As a result, the upward protrusion of the solid-liquid interface In is enhanced, and along with the thermal gradient (G) in the vertical direction near the solid-liquid interface In being increased, its horizontal distribution (ΔG) becomes uniform. Accordingly the range for pulling speed being capable of implementing a defect free region throughout the entire cross section of the silicon single crystal 20 is widened. This means the enhancement of the efficiency of production of a silicon single crystal 20 having defect free region being possible.

Here, if the upward curve of the magnetic field neutral plane NP is small, since the inclination of the magnetic lines in the downward direction at the inner surface of circumferential wall P of the crucible 11 is reduced, the vertical magnetic field component is decreased and the effect of controlling the convection C1 is decreased. For effectively suppressing the convection C1, it is necessary to form the cusp magnetic field so that the difference between the vertical position of the magnetic field neutral plane NP upon the rotation axis LX of the silicon single crystal 20 and the vertical position of the magnetic field neutral plane NP at the inner surface of circumferential wall of the crucible 11 is greater than or equal to 15 mm. At this state, the radius of the crucible 11 is, for example 450 mm, which is the radius of a crucible used in producing a silicon single crystal of diameter 300 mm.

Figure 3:
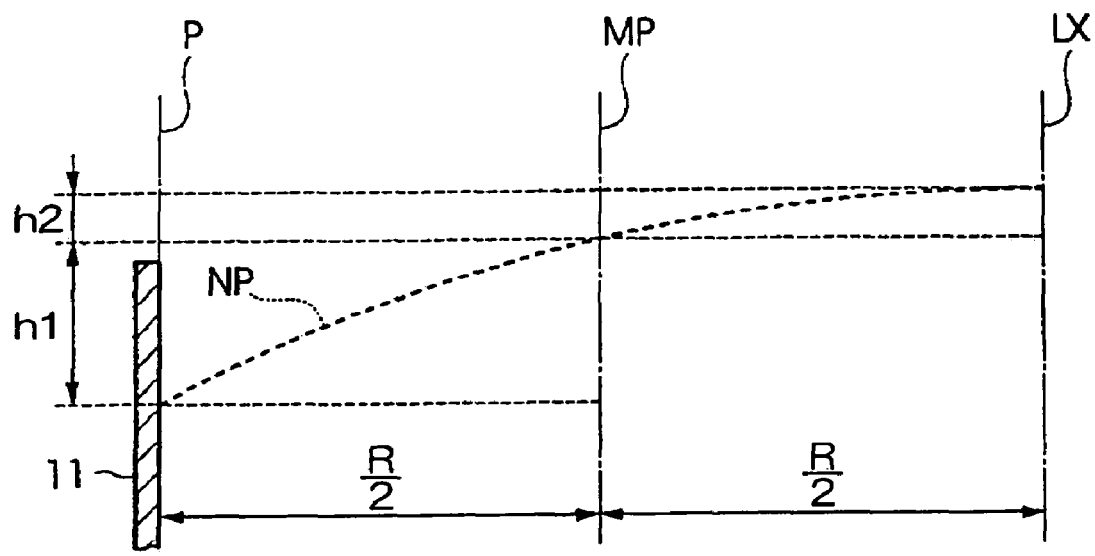
FIG. 3 is a figure showing an example of a desirable shape for a magnetic field neutral plane NP.

Furthermore, it is preferable that the magnetic field neutral plane NP have a shape shown in FIG. 3. FIG. 3 is a figure showing an example of a preferable shape for the magnetic field neutral plane NP. In FIG. 3, for the same members shown as shown in FIGS. 1 and 2, the same reference symbols are appended. Here, as shown in FIG. 3, an intermediate position MP between the rotation axis LX of the silicon single crystal 20 set in the central position of the crucible 11, and its inner surface of circumferential wall P is considered.

When half of the opening diameter of the crucible 11 (the radius of the crucible 11) is taken as R (for example 450 mm), the distance from the rotation axis LX to the intermediate position MP and also the distance from the intermediate position MP to the inner surface of circumferential wall P of the crucible 11 are both R/2. When the difference between the vertical position of the magnetic field neutral plane NP upon the rotation axis LN and that of the magnetic field neutral plane NP at the intermediate position MP is taken as h2, and the difference between the vertical position of the magnetic field neutral plane NP at the intermediate position MP and the vertical position of the magnetic field neutral plane NP at the inner surface of circumferential wall of the crucible 11 is taken as h1, it is preferable to form the shape of the magnetic field neutral plane NP in a shape satisfying Equation (1) and Equation (2) below simultaneously:

$$h_1 \geqq 10 \text{ mm} \quad (1)$$

$$h_2 \leqq 10 \text{ mm} \quad (2)$$

The state of the convection varies in accordance with the solidification ratio of the silicon melt M, that is to say, according to variation of the depth of the silicon melt M, and the most suitable distribution of the magnetic field also varies simultaneously. Therefore, in order to produce a silicon single crystal 20 having defect free region, it is necessary to optimize the cusp magnetic field applied to the silicon melt M. In this embodiment, by varying the upward curvature of the magnetic field neutral plane NP according to change in the depth of the silicon melt M, it is possible to maintain the beneficial effect of suppressing the above described convection C1 over a wide range, from the starting until ending of pulling the silicon single crystal.

To obtain the effective suppression of the convection C1, it is furthermore necessary to set the magnetic field neutral plane NP within the range of 30 to 120 mm below the solid-liquid interface In, and to form the cusp magnetic field so that the horizontal component of the magnetic flux density at the vertical position of the magnetic field neutral plane NP of the inner surface of circumferential wall P of the crucible 11 falls within the range of 0.02 to 0.09 T. Furthermore, when pulling the single crystal 20, along with rotating the crucible 11 at a rotation speed of less than or equal to 3 [min$^{-1}$], it is necessary to rotate the silicon single crystal 20 at a rotation speed of greater than or equal to 12 [min$^{-1}$].

By pulling the silicon single crystal 20 while satisfying the above conditions, it is possible to produce a silicon single crystal 20 having defect free region at high efficiency. However, when the silicon single crystal 20 is pulled in a state not satisfying the above described conditions, since the convections C1 and C2 shown in FIG. 2 are greatly altered, the upward protrusion of the solid-liquid interface In is remarkably restrained. If the solid-liquid interface In does not have an upwardly curved shape the height of the central portion of which exceeding 10 mm with respect to its peripheral portion, a sufficiently large thermal gradient (G) in the vertical direction near the solid-liquid interface In cannot be obtained, resulting in deterioration of the pulling speed of the silicon single crystal 20. As a result, the range of pulling speed being capable of implementing defect free region throughout the entire cross section of the silicon single crystal 20 is narrowed down, resulting in the deterioration of efficiency of production.

For producing a silicon single crystal 20 using the apparatus for producing a single crystal of the above described constitution, first, polycrystalline silicon raw material filled in the crucible 11 is heated up with the heater 12 to form silicon melt M, and the temperature of the silicon melt M is brought to a predetermined temperature. Next, electrical currents are generated in the upper coil 13a and in the lower coil 13b in mutually opposite directions, to apply to the silicon melt M a cusp magnetic field symmetric around the rotation axis of the silicon single crystal 20, and having magnetic field neutral plane NP curved in the upward direction.

Next, after the pulling wire W, to the end of which a seed crystal is fixed, is lowered downwardly, so that the lower end of the seed crystal is molten back by contacting against the surface of the silicon melt M, and is molten back, pulling in the upward direction is started. When pulling the pulling wire W, along with the crucible 11 being rotated at a rotation speed of less than or equal to 3 [min$^{-1}$] by the rotation device 15, the silicon single crystal 20 being pulled is rotated at a rotation speed of greater than or equal to 12 [min$^{-1}$].

While pulling the silicon single crystal 20, the magnetic field neutral plane NP is formed within the silicon liquid M, in the range of 30 to 120 mm below the solid-liquid interface In, and the cusp magnetic field is formed so that the horizontal component of the magnetic flux density at the vertical position of the magnetic neutral plane NP at the inner surface of circumferential wall of the crucible 11 is within the range of 0.02 to 0.90 T. The cusp magnetic field is set so that the difference between the vertical position of the magnetic field neutral plane NP upon the rotation axis LX and that of the magnetic field neutral plane NP at the inner surface of circumferential wall P of the crucible 11 is greater than or equal to 15 mm. Otherwise, the magnetic field neutral plane NP is set to a shape satisfying both of the Equations (1) and (2) described above.

As shown in FIG. 2, by the cusp magnetic field the neutral plane NP of which is curved in the upward direction, the convections C1 and C2 towards the bottom portion of the crucible 11 are promoted. Along with this the upwardly protruding shape of the solid-liquid interface In is enhanced by the increase of the rising flow at the center portion of the crucible 11, so that, for example, the height of the central portion of the upwardly protruding solid-liquid interface In exceeds 10 mm with respect to the peripheral portion. Because of this shape, thermal gradient (G) in the vertical direction near the solid-liquid interface In is increased. Therefore, a silicon single crystal having defect free region can be obtained even with high speed pulling of the single crystal. Thus, it is possible to produce a silicon single crystal having defect free region at good efficiency. When a depth of the silicon melt M is changed during pulling the silicon single crystal 20, the curvature in the upward direction of the magnetic field neutral plane NP is modified according to the change of the depth of the conductive melt M.

In the embodiment explained above, the case for producing a silicon single crystal of diameter 300 mm is explained as an example. If a silicon single crystal of a different diameter is to be produced, according to the diameter of the silicon single crystal, it is possible to make the appropriate modifications to the numerical values in the vertical direction with respect to the diameter of the crucible 11. For example, it is possible to have the corresponding ratios of the numerical values in the vertical direction according to the diameter ratio of the silicon single crystals.

The inventors of the present application produced a silicon single crystals 20 using the apparatus and method for producing a single crystal described above. Here, for producing the silicon single crystals 20, a 24 inch diameter quartz crucible was used as the crucible 11, and the various conditions during their production were set to the conditions shown in FIG. 4. FIG. 4 is a table showing the various conditions for producing silicon single crystals according to examples of the invention. In these examples, as the silicon single crystals 20, a P type silicon single crystals of diameter 200 mm was produced. For comparison, single crystal pulling is also performed applying a cusp magnetic field having a horizontal magnetic field neutral plane which was not curved.

Examples 1 to 6 in FIG. 4 are cases in which the pulling is performed under an application of the cusp magnetic field the shape of neutral plane of which being curved in the upward direction, whereas Comparative examples 1 to 4 are cases in which the magnetic field neutral plane have horizontal shape same as the cusp magnetic field in the conventional art. The degree of protrusion 1 in FIG. 4 means, where the internal diameter of the quartz crucible is taken as R, the vertical position of the magnetic field neutral plane at the R/2 position with respect to the vertical position of the magnetic field neutral plane at wall position. Furthermore, the degree of protrusion 2 means, where the internal diameter of the quartz crucible is taken as R, the vertical position of the magnetic field neutral plane at the position of the central rotation axis of the silicon single crystal with respect to the vertical position of the magnetic field neutral plane at the position of the wall of the crucible.

Figure 5:
FIG. 5 is a figure showing the pulling speed of a silicon single crystal in examples of the invention.

FIG. 5 is a figure showing the pulling speed for a silicon single crystal in examples of the invention. As shown in FIG. 5, during pulling of the silicon single crystal, the pulling speed V is adjusted so as to decrease linearly according to increasing solidification ratio. Sample were cut out by sectioning a crystal obtained in this manner in parallel to the crystal growth direction, and a sectional view of defect distribution were constructed from the measurements of the recombination lifetimes.

Figure 6:
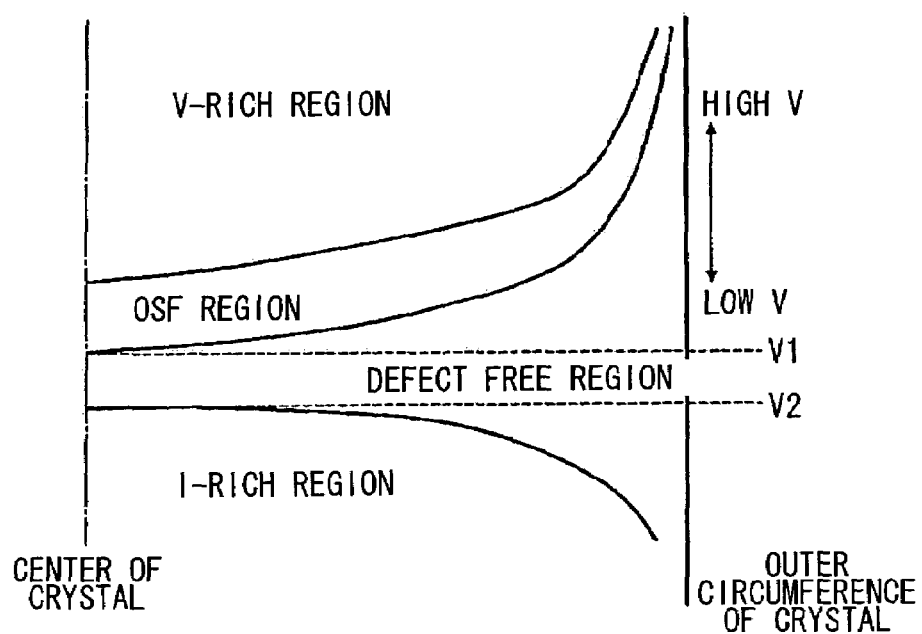
FIG. 6 is a figure showing a defect distribution in sectional view of a silicon single crystal produced in the examples of the invention.

FIG. 6 is a figure showing the sectional view of defect distribution of a silicon single crystal produced in examples of the invention. As shown in FIG. 6, when the pulling speed V of the silicon single crystal was high, a V-rich region (a region in which vacancy type point defects were predominant) was formed over almost the entire extent of the silicon single crystal from its center to its outer circumference. Along with decreasing pulling speed, along with an OSF region starting to be formed gradually over the silicon single crystal, from the vicinity of its outer surface towards its central vicinity, also a defect free region started to be formed at the outer circumferential portion of this OSF region. When the pulling speed V is still decreased, the OSF region disappeared, and a defect free region was formed over the entire silicon single crystal, from its center to its outer circumference. When the pulling speed V of the silicon was decreased further, a I-rich region (a region in which interstitial Si type point defects were predominant) started to be formed; and, when the speed was decreased yet further, this I-rich region was formed over almost the entire extent of the silicon single crystal, from its center to its outer circumference.

When constructing the sectional view of defect distribution of a silicon single crystal shown in FIG. 6, the pulling speed V1 at which the OSF region disappeared and the pulling speed V2 at which L/DLs appeared were obtained. From these, the speed range (V1-V2) for a defect free region occurring between the two defect-bearing region were obtained. Furthermore, the shape of the solid-liquid interface was measured from the same sample. The results of evaluation obtained via the above described procedure are collected together in FIG. 7. FIG. 7 is a table showing the results of evaluation of silicon single crystals produced with examples of the invention. In FIG. 7, the shapes of solid-liquid interface are shown as the height of the rotation axis center of the silicon single crystal with respect to the outermost circumferential portion of the crystal.

In FIG. 7, Example 1 to 6 are silicon single crystals produced by pulling in the state with the magnetic field neutral plane of the cusp magnetic field curved in the upward direction, while Comparative examples 1 to 4 are silicon single crystals produced by pulling with the magnetic field neutral plane extending horizontally, like a cusp magnetic field in the conventional art. As shown in FIG. 7, when Example 1 and Comparative example 1, Example 4 and Comparative example 2, Example 5 and Comparative example 3, and Example 6 and Comparative example 4 are respectively compared together, in each of these comparisons, the speed range (V1-V2) in which a defect free region appears is wider in the case of Examples 1 to 4, than in the case of Comparative examples 1 to 4.

When Example 1 and Examples 2, 3 are compared, it is possible to verify the beneficial effect due to the shape of the magnetic field neutral plane. By comparing Example 1 and Example 4, it is possible to verify the beneficial effect due to the position of the magnetic field. By comparing Example 1 and Example 5, it is possible to check the beneficial effect due to the magnetic field intensity. In Example 6, the silicon single crystal was pulled while setting the rotation speed of the crucible to 5 [min$^{-1}$], which is higher than the 3 [min$^{-1}$] determined in the present invention. In this case, the solid-liquid interface have almost horizontal shape, and the defect free region is narrowed down. According to the above comparisons, it is understood that the upward curvature of the shape of neutral plane of the cusp magnetic field, and related conditions as the distinguishing features of the invention, and effective with regard to enlarging the defect free region.

While preferred embodiments of the invention have been described above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An apparatus for producing a single crystal, comprising:
    a heating device which heats polycrystalline silicon raw material held in a crucible to form silicon melt; and
    a pulling up device growing a silicon single crystal while pulling it up from the silicon melt accompanied with rotation, wherein
    said apparatus is provided with a magnetic field generation unit which applies to said silicon melt a cusp magnetic field a shape of a neutral plane of which is symmetric around the rotation axis of the silicon single crystal and is curved in the upward direction.

2. An apparatus for producing a single crystal according to claim 1, wherein
    said magnetic field generation unit generates said cusp magnetic field so that a difference between a vertical position of said magnetic field neutral plane upon said rotation axis and a vertical position of said magnetic field neutral plane at a wall position of said crucible is greater than or equal to 15 mm.

3. An apparatus for producing a single crystal according to claim 1, wherein
    said magnetic field generation unit generates said cusp magnetic field so that a difference between a vertical position of said magnetic field neutral plane upon said rotation axis and a vertical position of said magnetic field neutral plane at an intermediate position between said rotation axis and a wall position of said crucible is less than or equal to 10 mm, and
    a difference between the vertical position of said magnetic field neutral plane at said intermediate position and the vertical position of said magnetic field neutral plane at a wall of said crucible is greater than or equal to 10 mm.

4. An apparatus for producing a single crystal according to claim 1, wherein said magnetic field generation unit varies a curvature of said magnetic field neutral plane in accordance with a solidification ratio of said silicon melt.

5. An apparatus for producing a single crystal according to claim 1, wherein
a rotation device which, when pulling said silicon single crystal, rotates said crucible at a rotation speed less than or equal to 3 min$^{-1}$; and
said magnetic field generation unit generates said cusp magnetic field so that a vertical position of said magnetic field neutral plane is within the range of from 30 mm to 120 mm below the solid-liquid interface, and a horizontal component of the magnetic flux density at a vertical position of said magnetic field neutral plane at a wall position of said crucible is within the range of from 0.02 T to 0.09 T; and
said pulling up device pulls said silicon single crystal while rotating it in a direction opposite to the rotation direction of said crucible at a rotation speed greater than or equal to 12 min$^{-1}$.

6. An apparatus for producing a single crystal according to claim 5, wherein,
when pulling said silicon single crystal, said pulling up device makes the shape of said solid-liquid interface upwardly protruding, with a height of its central portion exceeding 10 mm with respect to its peripheral portion.

* * * * *